PROCESS FOR MANUFACTURING MULTILAYER FILM CIRCUITS

Filed Jan. 20, 1964

2 Sheets-Sheet 1

INVENTOR.
JOHN P. PRITCHARD JR.

BY

E. Mickey Hubbard

ATTORNEY

INVENTOR.
JOHN P. PRITCHARD JR.
BY E. Mickey Hubbard
ATTORNEY 3,366,519

PROCESS FOR MANUFACTURING MULTILAYER FILM CIRCUITS

John P. Pritchard, Jr., and Joe T. Pierce, Richardson, Tex., assignors to Texas Instruments Incorporated, Dallas, Tex., a corporation of Delaware Filed Jan. 20, 1964, Ser. No. 339,018
6 Claims. (Cl. 156—3)

ABSTRACT OF THE DISCLOSURE

Disclosed are multilayer thin film circuits such as cryogenic circuits and methods of making the same. The method is particularly directed to photo-resist techniques for forming multilayer thin film circuits wherein the photo-resist material serves as an insulating layer between adjacent metal films.

The present invention relates to multilayer thin film circuits and more particularly, but not by way of limitation, relates to a process for manufacturing cryogenic circuits and to a novel cryotron construction.

In general and for purposes of this disclosure, cryogenic circuits may be considered as those circuits which are operated at such low temperatures that the metal conductors are superconductive, and exhibit no resistance until the current flowing therein exceeds a critical limit at which point the metal abruptly converts back to normal resistivity. Different metals have different critical current levels for various common superconductive temperatures and magnetic field strengths. A cryotron utilizes this phenomenon to provide a means for switching a particular carrier conductor from superconductive to resistive. A cryotron is formed by positioning a control metal conductor having a relatively high critical current at the operating temperature in close proximity to a gate metal conductor having a relatively low critical current. A current in the control conductor at a level below the critical current for that conductor will nevertheless create a magnetic field adjacent the carrier conductor which will switch the carrier conductor from super-conductive to normal resistance.

The widths of the adjacent conductors of a cryotron are important design considerations for insuring superconductive current flow and for insuring that sufficient current will be induced to cause the cryotron to switch. The conductors must be sufficiently thick over their entire width to have the necessary diamagnetic characteristics. It is also extremely important that the edges of the conductors, particularly that portion of the control conductor overshadowing the carrier, be very sharp, smooth and substantially squared. If the edges of the conductors are not squared, the switching curve from superconductivity to normal resistance will extend over a considerable current range. On the other hand, we have found that if the conductors can be made precisely square, the switching curve very closely approximates a completely abrupt transition from superconductivity to normal resistance upon reaching the critical current level for the particular operating temperature.

One particularly interesting application of cryogenic circuits is in the field of computers and considerable effort has been directed toward developing suitable circuits and, in particular, toward developing processes for manufacturing the circuits in relatively thin film form. Substantially all techniques employed to date utilize some type of mechanical stencil to deposit the necessary metals and insulators in the necessary patterns to produce the desired circuits on a suitable substrate. These efforts have been generally unsuccessful. Stencil masking techniques usually employ a relatively large number of masks having very fine slits through which the metal conducting paths are deposited by vapor deposition or other suitable deposition method. These masking techniques are severely limited due to the fact that the stencils must be sufficiently stiff to withstand handling and to be pressed tightly against the surface of the substrate so as to reduce leakage of the deposition metals under the stencil. The alignment of the stencil presents a considerable problem, particularly when it is considered that this must usually be done remotely in a vacuum chamber. After the stencil is clamped tightly against the substrate, it must then resist high temperature warpage. This requires that the stencils be made unduly large and relatively thick. As the stencils become thicker the shadow problems, resulting from the fact that the source is not precisely perpendicular to the substrate, are magnified. Further, the stencil techniques of necessity have a large number of photographic steps in the production of the stencils which reduce the sharpness of the edges of the slits and the overall accuracy of layout. As previously mentioned, the sharpness of outlines is extremely important because it directly affects the transition from superconductive to resistive states. The sharpness of outline and the mechanical limits of producing a great number of closely spaced slits also materially limit the size of the components and therefore the component density of the circuit, or alternatively require a significantly larger number of process steps and masks.

The present invention provides a process for manufacturing multilayer film circuits. The process was conceived and developed for and is particularly adapted for manufacturing complex cryogenic circuits having unusually high component densities but is highly useful in many other thin film circuit applications such as interconnections on integrated semiconductor arrays. The process entails successively forming alternate metal and insulating films over a substrate and removing predetermined areas of each metal film before the deposition of the next film to form parts of the circuit, and removing predetermined areas of each insulating film where electrical contact between areas of adjacent metal films is necessary to complete the circuit.

In accordance with an important aspect of the invention, the areas of the metal films are removed by first protecting those areas of the metal film to be retained by an etchant resisting film, then removing the unprotected areas of the metal film with a suitable selective etchant. In particular, the metal film is coated with a photo-resist material which is subsequently exposed and developed to remove the photo-resist film from the areas of the metal film which are to be removed.

Another important aspect of the invention is that the insulation films are formed by depositing a photosensitive material over the substrate, exposing the photosensitive material to activating radiant energy to change its chemical state in the exposed areas such that either the exposed or unexposed areas result in a form not removed by subsequent developer action. The film of material remaining over the other areas then serves as the insulating film.

The present invention also contemplates a novel multilayer, cryogenic circuit construction and a novel cryotron construction as will hereafter be described in greater detail and pointed out in the appended claims.

An important object of the present invention is to provide a process of the type described which is relatively simple and economical.

Another object of the invention is to provide a process of the type described which utilizes photographic techniques and which requires a minimum number of steps for a particular complex circuit.

Still another object of the invention is to provide a process for manufacturing cryotron circuits having superior operating characteristics.

Yet another object of the invention is to provide a process of the type described wherein very high component densities can be obtained.

A still further object of the invention is to provide a process of the type described which can be used to manufacture circuits having substantially any number of layers, and conductor cross-overs.

Yet another objective of the invention is to provide a process of the type described which requires a minimum investment in equipment.

Another object of this invention is to provide a process for rapidly producing substantially any circuit design after a minimum preparation time so that bread board circuits can be constructed quickly and economically.

A further object of the invention is to provide a process of the type described which reduces the problem of aligning the components of successive layers to a minimum.

Still another object of the invention is to provide an improved cryotron construction which is very economical in construction yet which can be repeatedly cycled between room and cryogenic temperatures without deleterious effects.

Still another object of the present invention is to provide a process of the type described by which the conductor and component edges can be made very sharp and accurately placed so as to improve the operating characteristics of the components and to materially increase the component density which can be attained.

Many additional objects and advantages of the present invention will be evident to those skilled in the art from the following detailed description and drawings, wherein.

Figure 1:
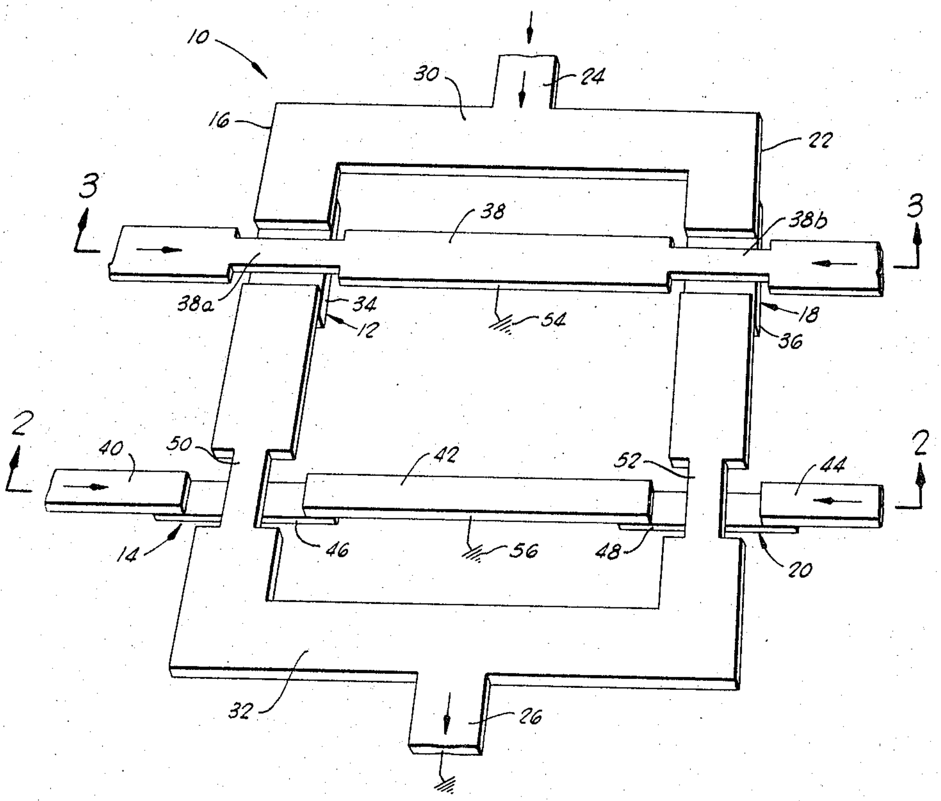
FIGURE 1 is a somewhat schematic perspective view of a simple flip-flop circuit with the spacing between the circuit elements and the thickness of the elements exaggerated and the insulating layers removed, and serves to illustrate the process of the present invention.
Figure 4:
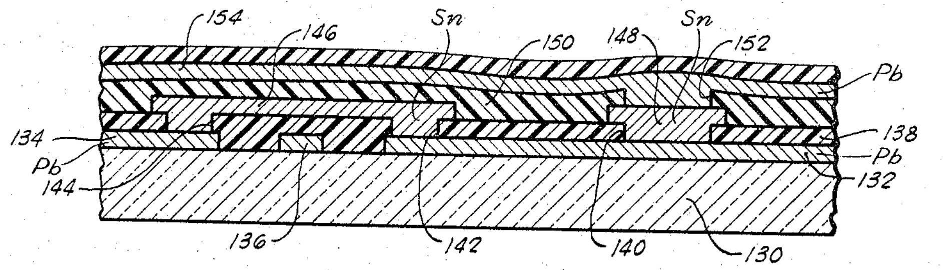
FIGURE 4 is a sectional view similar to FIGURES 2 and 3 illustrating another circuit construction and process in accordance with the present invention.

Referring now to the drawings, and in particular to FIGURE 1, a simple flip-flop circuit constructed by the process of the present invention is indicated generally by the reference numeral 10. The circuit 10 is formed by a first lead (Pb) loop segment 30 which includes the conductor portion 24, a second Pb loop segment 32 which includes the conductor 26, and the tin (Sn) gate strips 34 and 36. A Pb control conductor 38 has necked portions 38a and 38b which cross the Sn gates 34 and 36 to form switching cryotrons 12 and 18, respectively. The center of the control conductor 38 is connected to ground by suitable conductor means 54. A current sensing circuit is formed by Pb conductor strips 40, 42, and 44 which are interconnected by Sn gate strips 46 and 48. The Sn gate strips 46 and 48 are disposed under necked portions 50 and 52 of the loop segment 32 to form sensing cryotrons 14 and 20. The center of the Pb conductor strip 42 is connected to ground by a suitable conductor means 56. The insulation layers between the Sn and Pb strips have been omitted from FIGURE 1 in order to simplify the drawing and more clearly illustrate the circuit components. However, it will be appreciated that the Sn gates 34, 36, 46 and 48 are insulated from the respective overshadowing Pb necked portions 38a, 38b, 50 and 52.

In operation, current is directed through the conductor 24 into the parallel paths 16 and 22. Assuming that cryotrons 12 and 18 are both superconductive, the current divides between the parallel paths 16 and 22 in inverse proportion to the inductance of the respective paths. By passing sufficient current through the necked portion 38a to ground connection 54, the resistance of the superconductive Sn gate 34 is restored and the cryotron 12 switched "off." All current will then flow through superconducting path 22 including the Sn gate 36 and the Pb necked portion 52. A sufficient current passing through the Pb necked portion 52 will switch the sensing cryotron 20 "off" such that the Sn gate 48 will have normal resistance, which fact will be an indication that current is flowing in path 22.

On the other hand, if current is introduced through the necked portion 38b to ground 54, the cryotron 18 will be switched "off" and current will flow through parallel path 16. The current flow through the necked portion 50 will switch the cryotron 14 "off" and serve to indicate that current is flowing through the parallel path 16.

The process of the present invention may be more easily understood by reference to the drawings of the circuit 10. In general, the process comprises the steps of applying alternate films of conductive and non-conductive material over substantially the entire face of a substrate. After each conductive film is applied, selected areas of the film are removed to form portions of the circuit. After each insulation film is applied, selected areas of the insulation films are also removed in areas where it is desired to make electrical contact between the successive electrically conductive layers.

Figure 2:
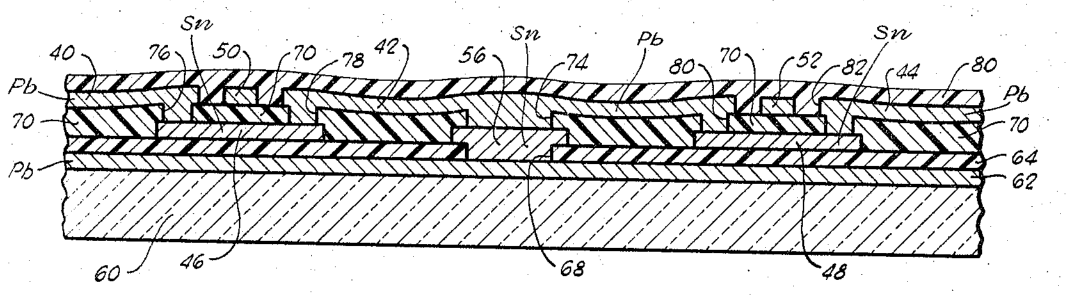
FIGURE 2 is a sectional view, taken generally on lines 2—2 of FIGURE 1.
Figure 3:
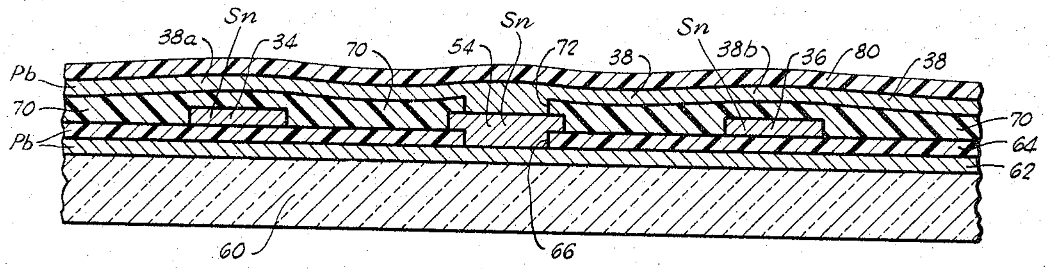
FIGURE 3 is a sectional view taken substantially on lines 3—3 of FIGURE 1.

The more specific aspects of the invention can be best understood by referring to FIGURES 2 and 3 which are sectional views taken generally on the lines 2—2 and 3—3, respectively, of FIGURE 1, but also illustrate the various insulation layers of the circuit which are omitted from FIGURE 1. First, a suitable substrate 60, preferably a soda lime glass square approximately 2″ x 2″, is placed in a vacuum system which is then pumped down to approximately $10^{-5}$ mm. of Hg. However, it is to be understood that other substrates can be employed without departing from the scope of the invention. For example, flexible substrates such as Mylar film can be used. The vacuum system is then backfilled to approximately $10^{-3}$ mm. of Hg with argon or oxygen and an A-C glow discharge established in such a position that the substrate is located in the dark column. The glow discharge is carried out for five to fifteen minutes to improve adhesion of subsequent layers to the substrate.

After the glow discharge treatment, the vacuum system is again pumped down to about $10^{-5}$ mm. of Hg and a film of Pb 62 is deposited over the entire face of the substrate 60. This can be accomplished using standard vapor deposition techniques wherein a lead source is heated in the vacuum chamber at a point spaced below the substrate and the vapor is directed upwardly through a chimney to impinge and condense upon the substrate surface. The Pb 62 film may range from 1,000 to 10,000 A. in thickness depending upon the design of the particular circuit being constructed.

Next, predetermined portions of the Pb film 62 are removed to construct portions of the circuit as will hereafter be described. This can be accomplished using the following process. The substrate 60 with the Pb film 62 is transferred from the vacuum system to a dry box in which the atmosphere is controlled to eliminate dust, moisture, oxidizing agents and other deleterious substances. A coat of photo-resistant material, such as Azoplate AZ–17 sold by the Shipley Manufacturing Company of Wellesley, Massachusetts, is then applied to the surface of the Pb film over the entire surface of the substrate. The AZ–17 is a positive photo-resist and when exposed to ultraviolet light is converted to a compound which can be removed by an AZ–17 developing fluid sold by the same manufacturer. This type of photo-resist is believed to be described in U.S. Patents 2,958,599, 2,975,053, 2,989,455, 2,994,608, 2,994,609, 2,995,422. After the AZ–17 is developed only the unexposed areas remain. The unexposed areas can subsequently be removed by a suitable stripper such as acetone. After the Pb film 62 is coated over its entire surface with AZ–17 and is dried in a non-detrimental ambient such as nitrogen or argon, it may be baked at a low temperature of about 95° C. to improve its adhesion to the Pb film.

After the AZ–17 coat has cured a photo mask, having transparent portions in predetermined areas where the Pb film 62 is to be subsequently removed and opaque portions where the Pb film 62 is to be retained, is generally aligned over the substrate 60 and then moved in close proximity to the Pb film 62 to reduce shadowing effects. The masked substrate is exposed to an ultraviolet light source for a suitable period of time. The substrate is then immersed in the AZ–17 developer to remove the exposed areas of the AZ–17 coat and then dipped in deionized water to kill the action of the developing fluid.

Next, the substrate 60 with the Pb film 62 and remaining portions of the coat of AZ–17 is immersed in a selective etchant which will not attack the protective coat of AZ–17 but will attack the exposed areas of the Pb film. A 10–50% solution, by volume, of $HNO_3$ serves as a very good selective etchant for this purpose. After the necessary time, the substrate is again quenched in deionized water to kill the etchant and is dried in a non-detrimental ambient so as not to oxidize the surface of the Pb. The remaining AZ–17 coat is then removed by immersing the substrate in a suitable stripping fluid, such as acetone, and dried with an inert gas. Again it is desirable to maintain the Pb film in a non-detrimental atmosphere to prevent oxidation or other contamination of the surface. At this point it is well to note that the first Pb film 62 serves as a ground plane (which is not illustrated in FIGURE 1) for the flip-flop circuit 10 and normally will extend under all component parts and conductors of the flip-flop circuit 10. The ground planes will usually have suitable exposed tab portions for connection in a circuit.

Next, an insulating film 64 is applied over the surface of the Pb film 62 and substrate 60 by a suitable technique. In accordance with an important aspect of the invention, the insulating film 64 is a photosensitive material such as that marketed by Kodak under the trade name KPR. KPR is a negative photo-resist material and when exposed to ultraviolet light is polymerized in the exposed areas. The unexposed areas of the KPR film can then be removed by a simple developing process using KPR developing fluids sold for this purpose by Kodak. It is believed that the KPR type photo-resist is disclosed in its various aspects in U.S. Patents 2,690,966; 2,732,301; 2,861,057.

After the KPR coat has been dried, a second opaque and transparent photo mask is precisely indexed with the pattern previously etched from the Pb film 62 and pressed against the substrate. The KPR film is exposed to ultraviolet light in all areas except where electrical contact is desired between film circuitry to be subsequently deposited and the ground plane formed by the Pb film 62, including the two areas 66 and 68 as can be seen in FIGURES 2 and 3. Then, when the substrate 60 and Pb films thereon are immersed in the developer for the KPR coat, the unexposed portions 66 and 68 are removed by the developing fluid to leave windows 66 and 68 in the polymer insulating film 64 so that the next metal film will be deposited through the windows and make the electrical contacts 54 and 56 with the Pb ground plane 62.

The substrate 60 including the Pb film 62 and the KPR insulating film 64 having the windows 66 and 68 are then placed in the vacuum system once again. Care should be taken to minimize oxidation of the surface of the Pb film 62 exposed by the windows 66 and 68. The vacuum system is then pumped down to about $10^{-5}$ mm. of Hg and the exposed surface of the Pb film 62 cleaned by glow discharge as previously described. Then an Sn film is deposited over the entire area of the substrate and over the insulating film 64 to ultimately form the Sn gate strips 34,

36, 46 and 48. The Sn film extends through the windows 66 and 68 of the insulating film 64 and makes conductive contact with the surface of the Pb ground plane 62 to form the electrical ground connections 54 and 56.

The substrate is then removed from the vacuum system and predetermined areas of the Sn film removed in the same manner as previously described in connection with the Pb ground plane film 62. First a coat of AZ–17 is applied over the surface of the substrate and dried as previously described. A third photo mask having the necessary opaque and transparent areas is then precisely indexed with the previous Pb and insulating film patterns laid down on the substrate and the AZ–17 coat exposed to ultraviolet light in predetermined areas where the Sn film is to be removed. The Sn film is removed from all areas except for the gate strips 46 and 48 illustrated in FIGURES 1 and 2, and gate strips 34 and 36 illustrated in FIGURES 1 and 3. The AZ–17 coat is also left unexposed in an area overshadowing the windows 66 and 68 in the insulating film 64 such that pedestals of Sn will be left to form the ground connections 54 and 56. The AZ–17 coat is then developed so as to remove the exposed portions and retain the unexposed portions to protect the areas 46, 48, 34, 36, 54 and 56 of the Sn film.

The substrate 60 is then dipped in a suitable selective etchant fluid, such as the $HNO_3$ solution previously described, to remove all of the unprotected Sn film. During this etching step, the polymer insulating film 64 protects the Pb ground plane film 62 from the etchant. In this regard, it will be noted that the Sn conductor pedestals 56 and 54 preferably overlap the edges of the windows 66 and 68 formed in the insulating film 62 to insure that the etchant does not penetrate to the Pb film 62. After the Sn has been etched away, the remaining AZ–17 coat is stripped from the surface of the retained Sn film strips.

After the Sn film forming the areas 34, 36, 46, 48, 54 and 56 has been formed, a second insulating film 70 is deposited over the surface of the substrate by coating the substrate with KPR and permitting the KPR to dry as previously described. Next a fourth photo mask is precisely indexed over the substrate. The photo mask is opaque in the areas corresponding to the windows 72 and 74 which are disposed over the Sn pedestals 54 and 56. The photo mask is also opaque over the areas corresponding to the windows 76 and 78, which overshadow the opposite ends of the Sn gate strip, is opaque in the areas 80 and 82 which overshadow the ends of the Sn gate strip 48, and is opaque in areas (not illustrated) over the opposite ends of the Sn gate strips 34 and 36. The masked KPR coat is then exposed to ultraviolet light which polymerizes the KPR in the exposed areas. When the KPR is developed, a continuous polymer insulating film remains over the surface of the substrate except in the areas where electrical contact is to be made through the insulating film 70.

The substrate is then returned to the vacuum chamber while taking care to maintain the substrate in a controlled atmosphere so as to prevent oxidation or contamination of the exposed surfaces of the Sn film. The Sn film is particularly susceptible to oxidation and contamination and should be thoroughly cleaned by an A.-C. glow discharge process as previously described. If the surface of the Sn is not thoroughly clean, the contaminants can interfere with the superconductivity of the joint with the Pb film presently to be laid down. Next a second Pb film is vapor-deposited over the substrate as previously described. Portions of the second Pb film are then removed to form circuit components by the photographic processes previously described. First, the Pb film is coated with AZ–17, covered by a suitable photo mask, and exposed to ultraviolet light in the areas where the Pb film is to be removed to form the circuit components presently to be described. The substrate is then immersed in an $HNO_3$ etchant solution as previously described to etch away the exposed areas of the Pb film and form the loop portions 30 and 32 of the parallel paths 16 and 22, the strip portions 40, 42 and 44 of the sensing circuit, and the strip portion 38 of the control circuit as can also be seen in FIGURE 3.

By reference to FIGURE 2, it will be noted that the Pb film of the strip portion 42 passes through the window 74 in the insulating film 70 and bonds to the Sn pedestal 56 to complete the electrical connection to the ground plane 62. Similarly, the Pb film forming the conductor strips 40 and 42 passes through the windows 76 and 78 in the insulating film 70 and bonds to the ends of the Sn gate strip 46. The other end of the Pb conductor strip 42 and the end of the Pb conductor strip 44 pass through the windows 80 and 82 in the insulating film 70 and bond to the Sn gate strip 48. It will be noted that the necked portions 50 and 52 of the cryotrons 14 and 20 are separated from the Sn strips 46 and 48, respectively, by portions of the insulating film 70. Similarly, the necked portions **38*a* and 38*b* are separated from the Sn gate strips 34 and 36 of the cryotrons 12 and 18 by the insulating film 70**, as can be seen in FIGURE 3.

Finally, an insulating film 70 is applied over the entire surface of the substrate by applying a coat of KPR and exposing the entire surface except in areas where it may be desired to make electrical contact with the circuit from an external source, such as to the ends of conductor strips 24, 38, 40 and 44. The circuit is then substantially complete.

An important aspect of this invention is the ease and speed with which the process can be carried out. The photo masks used in exposing the various photo-resist films may be fabricated using simple drafting and photographic techniques. The intricate circuits can be initially drawn at much larger scale for precision and then photographically reduced in size to produce the opaque and transparent masks for placement over the rather small substrates which have been effectively used. This procedure is far simpler than the techniques necessary to produce the stencils used by other prior art processes, and can be accomplished in only a few hours so that custom or bread-board circuits are practical using the process of the present invention.

The process can be practiced with a relatively small equipment investment. A simple vacuum system may be used for depositing the metal films. In accordance with the broader aspects of the invention, it is to be understood that the metal films may be deposited using any suitable technique, such as sputtering, for example. The photographic and etching steps of the invention may be practiced with very simple atmospheric control chambers and photographic devices. Although a very important specific aspect of the present invention entails the use of the photographically sensitized polymer as the insulating films as previously described, it is also to be understood that any suitable insulating material may be used which can be selectively etched in the desired patterns and will resist the etchant for the metals. Also, the AZ–17 may be used for this purpose because it can be cured by heat treatment so as to resist the stripper fluid and metal etchants. However, the polymer resulting from the exposure and development of KPR has been found to be particularly well suited for cryogenic circuits because it does not collapse or shatter at the low temperatures and does not deteriorate as a result of repeated cycling between room and cryogenic temperatures. The Pb and Sn have also been found to be particularly well suited for the present process of manufacturing cryogenic circuits involving cryotrons; however, the applicability of the process is not limited to Pb and Sn, but may be applied with respect to other appropriately chosen metals. Accordingly, another important aspect of the present invention is a novel cryotron construction using a polymer insulation between the dissimilar cryogenic metals.

Another very important aspect of the invention is the sharpness with which the edges of the conductor strips can be formed by the process of the present invention. The edges of the conductors are so uniformly square that the transition curves of the cryotrons constructed by the process of the present invention indicate perfectly abrupt switching from superconductive to resistive states as the current increases to the critical current level for the superconductor at the operating temperature. Insofar as the currents and resistances can be measured with most laboratory equipment, curves plotted for cryotrons constructed in accordance with the present invention are equivalent to theoretically ideal curves. The very sharp edge lines of the conductor portions of the circuits together with the ground plane 62 permit the conductor strips to be placed in very close proximity with spacings approaching the thickness of the metal film. This permits an extremely high component density to be effectively attained without cross talk between the adjacent components and the adjacent conductors. For example, it is possible to place as many as 1000 associative memory cells on a single 2" x 2" glass substrate, with each memory cell having 12 cryotrons, and still leave the border portions of the substrate for connection purposes. It will also be appreciated that circuits of this complexity can be made in which three or more metallic films are stacked in shadowed relationship and separated by insulating films using the novel process described above.

The order in which the conductive layers are deposited may be varied as desired to obtain substantially any circuit configuration. Accordingly, the circuit of FIGURE 1 can be laid down in inverse order as illustrated in FIGURE 5. In this case, a Pb film is deposited upon the glass substrate 130 and etched to form the conductor strips 132 and 134 and the necked down control conductor 136 of a cryotron. Next, an insulation film 138 is formed by coating the substrate with KPR. During the exposure and development process, a window 140 is left where it is desired to ultimately establish electrical contact between the conductor 132 and the ground plane. Windows 142 and 144 are also provided in the insulation film 138 over the adjacent ends of the Pb conductor strips 132 and 134. Then a film of Sn is deposited over the substrate and subsequently etched away to form the Sn gate strip 146 of the cryotron and a Sn pedestal 148 which is in electrical contact with the conductor strip 132. A second insulating film 150 is then formed over the substrate by applying a coat of KPR and developing the coat to produce the desired polymer. During the development process however, a window 152 is left over the Sn pedestal 148. Then a second Pb film 154 is deposited over the substrate to form the ground plane and passes through the window 152 and is bonded to the Sn pedestal 148 to complete the electrical circuit between the conductor strip 132 and the ground plane 154. The ground plane film 154 is etched to the desired pattern. A final insulation film 156 is formed by coating the substrate with KPR and developing the coat to leave any contact tabs for connecting the circuit to another circuit as required.

In accordance with another embodiment of the process of this invention, the insulation layer between successive conductive films may be formed by the positive photosensitive material, such as AZ–17, which is also used to pattern the previous metal film as heretofore described. A positive photosensitive material, such as AZ–17, is one that is removed by the development process in the area exposed to light or other radiation.

In the alternative process, the AZ–17, or other positive photo-resist, is applied to the metal film, is exposed to ultraviolet light in the areas where the metal film is to be removed, and is then developed to remove the AZ-17 in the exposed areas and leave the metal unprotected. Then the unprotected metal is removed by a selective etchant fluid. The AZ–17, which has not been exposed in the area still remaining, is then exposed once again to the ultraviolet light in the areas where it is desired to make electrical contact between the metal film which has now been patterned and the next metal film to be deposited. Then when the AZ–17 is again developed, areas exposed the second time will be removed to leave a window through which the next metal film will penetrate to make electrical contact with the previous film. The unexposed AZ–17 is then cured by heating so that it will not be affected by subsequent exposure to ultralight or by subsequent immersion in the developing, stripping or etching fluids.

When the metal film is removed by the etchant, the etchant will remove the edge of the metal back to a point slightly under the edge of the AZ–17 so that the subsequently deposited metal film will not contact the metal film and form an electrical short. This process variation eliminates the need for applying the negative photosensitive resist KPR and reduces the number of steps in the process.

From the above detailed description of several preferred embodiments of the invention, it will be appreciated by those skilled in the art that a novel and highly useful process for manufacturing multilayer film circuits has been described. The process is particularly adapted for manufacturing minute and complex cryogenic circuits having high component densities. The process is capable of producing cryotrons having superior operating characteristics. A novel cryotron has also been described which may be manufactured by the process of the invention. The cryotron construction can be repeatedly recycled between room and cryogenic temperatures without deleterious effects. A novel cryogenic circuit structure has also been described which employs metals and insulators which are very practical. However, is to be understood that although specific applications using metals have been described in detail, various electrically conductive materials other than metals may also be utilized without departing from the present invention. Although the novel process has been described in connection with thin film cryogenic circuits and is particularly well suited for manufacturing these circuits, it is to be understood and it will be appreciated by those skilled in the art that the process can be used to manufacture a large variety of multilayer circuits having film thicknesses covering a relatively wide range and having a relatively wide variety of active and passive components. Further, it will be appreciated that any photosensitive or otherwise self-patternable material which is sensitive to radiant energy may be used for the protective films and insulating films, provided that it has the other necessary properties.

Although several preferred embodiments of the present invention have been described in detail, it is to be understood that various changes, substitutions and alterations can be made therein without departing from the spirit and scope of the invention as defined by the appended claims.

What is claimed is:

1. A process for manufacturing multilayer thin film circuits comprising the sequential steps of:
depositing a first metal film on a substrate,
applying a first coat of photo-resist over the metal film,
exposing the first coat of photo-resist in predetermined areas to change the chemical properties of the material in the exposed areas from that in the unexposed areas,
developing the photo-resist to remove the photo-resist in one of the areas,
subjecting the substrate to a selective etchant fluid to remove the metal film in the areas where the photo-resist has been removed,
removing the remaining portions of the first coat of photoresist by a stripping solution,
applying a second coat of photo-resist over the first metal film and substrate which will form an insulating layer when exposed and developed,
exposing the second coat of photo-resist and developing the second coat of photo-resist to remove the photo-resist in areas over the first metal film where electrical contact is to be made between the first metal film and subsequently deposited metal films, and
depositing said second metal film on the exposed area of said first metal film and the remaining portions of said photo-resist insulating layer whereby predetermined portions of said first metal film and said second metal film are insulatively spaced by portions of said second coat of photo-resist.

2. The process defined in claim 1 wherein the photo-resist used for the insulating layers is a negative photo-resist which is fixed in areas where exposed and removed by the developing fluid in areas where not exposed.

3. The process defined in claim 1 wherein the photo-resist used for the insulating layers is a positive photo-resist which is removed by the developing fluid in areas where exposed and retained where unexposed, and further characterized by the step of fixing the photo-resist remaining after development before the next successive metal film is deposited.

4. A process for manufacturing multilayer circuits comprising the sequential steps of:
depositing a first metal film on a surface of a substrate,
applying a coat of positive photo-resist over the first metal film,
exposing the coat of positive photo-resist in areas where portions of the first metal film is to be removed to form conductors,
developing a coat of positive photo-resist to remove the exposed areas of the photo-resist and leave the first metal film unprotected in the exposed areas,
immersing the substrate in a selective etchant fluid to remove only the areas of the first metal film left unprotected,
removing the remaining portions of the positive photo-resist by a stripping solution,
applying a coat of negative photo-resist over the remaining portions of the first metal film and the substrate,
exposing the coat of negative photo-resist in areas where an insulating layer is to be formed,
developing the coat of negative photo-resist to remove the unexposed areas of the photo-resist and produce a polymer film over the first metal film except over areas where electrical contact is to be made between the first metal film and subsequently deposited metal films, and
repeating the sequence of steps at least to the extent required to deposit and pattern a second metal film.

5. In a process for manufacturing a thin film cryogenic circuit, the steps of:
depositing a first superconductive metal film over a substrate, the first metal film having a relatively high critical current level at a selected operating temperature,
applying a first coat of photo-resist over the first metal film, exposing the first coat of photo-resist in predetermined areas, and developing the first coat of photo-resist to remove the photo-resist in predetermined areas and leave the first metal film unprotected in said predetermined areas,
immersing the substrate in a selective etchant to remove only the predetermined areas of the first metal film left unprotected by the first coat of photo-resist,
removing the remaining portions of the first coat of photoresist by a stripping solution,
applying a second coat of photo-resist over the substrate and first metal film, exposing the second coat of photo-resist in predetermined areas, and developing the second coat of photo-resist to form a first polymer insulating layer over the substrate and first metal film having apertures where electrical contact is desired between the first metal film and a subsequently deposited metal film, depositing a second metal film having a relatively low critical current level at the selected operating temperature over the first polymer insulating film such that the second metal film contacts the first metal film plane where exposed through the first polymer insulating layer, applying a third coat of photo-resist over the first polymer insulating film and the second metal film substrate, exposing the third coat of photo-resist in predetermined areas, and developing the third coat of photo-resist to remove the photo-resist in predetermined areas and thereby leave the second metal film unprotected in said predetermined areas, immersing the substrate in a selective etchant fluid to remove only the predetermined areas exposed through the third coat of photo-resist, removing the remaining portions of the third coat of photo-resist by a stripping solution, applying a fourth coat of photo-resist over the second metal film and the first polymer insulating film, exposing the fourth coat of photo-resist in predetermined areas, and developing the fourth coat of photo-resist to form a second polymer insulating layer over the second metal film and the first polymer insulating film having apertures where electrical contact is desired between the second metal film and a subsequently deposited metal film, depositing a third metal film over the second polymer insulating film such that the third metal film extends through any openings in the second polymer insulating layer into electrical contact with the second metal film exposed therethrough, the third metal film having a relatively high critical current level at the selected operating temperature, applying a fifth coat of photo-resist over the third metal film, exposing predetermined areas of the fifth coat of photo-resist, and developing the fifth coat of photo-resist to remove the photo-resist in predetermined areas and leave the third metal film unprotected in said predetermined areas, and immersing the substrate in a selective etchant fluid to remove the unprotected portions of the third metal film.

6. In a process for manufacturing multilayer film circuits, the sequential steps of:

depositing a metal film on a surface of a substrate, applying a coat of positive photo-resist over the metal film, exposing the coat of positive photo-resist in predetermined areas where the metal film is to be removed, developing the coat of positive photo-resist to remove the photo-resist in the predetermined areas and leave the predetermined areas of the metal film unprotected, subjecting the substrate to a selective etchant fluid to remove the metal film in the unprotected areas, exposing the coat of positive photo-resist a second time in second predetermined areas where electrical contact between the first metal film and a metal film subsequently to be deposited is desired, developing the photosensitive material to remove the photo-resist in the second predetermined areas, and fixing the remaining photosensitive material to thereafter prevent its removal after subsequent exposure and development whereby the fixed photosensitive material will serve as an insulating layer between said first metal film and said metal film subsequently to be deposited.

References Cited

UNITED STATES PATENTS

| | | | |
|---|---|---|---|
| 2,711,983 | 6/1955 | Hoyt. | |
| 2,966,647 | 12/1960 | Lentz | 338—32 |
| 3,059,196 | 10/1962 | Lentz | 338—32 |
| 3,115,423 | 12/1963 | Ashworth. | |
| 3,219,749 | 11/1965 | Shuster et al. | 153—3 |

FOREIGN PATENTS

| | | |
|---|---|---|
| 240,248 | 9/1962 | Australia. |
| 1,345,163 | 10/1963 | France. |

OTHER REFERENCES

Method of Producing Three Dimensional Printed Circuits, Klippel IBM Disclosure Bulletin, vol. 2, No. 4, December 1959, pp. 7 and 8.

JACOB H. STEINBERG, *Primary Examiner.*